(12) United States Patent
Kodera

(10) Patent No.: US 8,817,478 B2
(45) Date of Patent: Aug. 26, 2014

(54) COMMUNICATION DEVICE AND METHOD OF COUPLING ELECTRICALLY CIRCUIT BOARDS

(75) Inventor: Eiichi Kodera, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 392 days.

(21) Appl. No.: 13/241,690

(22) Filed: Sep. 23, 2011

(65) Prior Publication Data

US 2012/0120619 A1 May 17, 2012

(30) Foreign Application Priority Data

Nov. 15, 2010 (JP) ................................. 2010-254362

(51) Int. Cl.
*H05K 1/00* (2006.01)
(52) U.S. Cl.
USPC .......................................................... 361/749
(58) Field of Classification Search
USPC .......................................................... 361/749
See application file for complete search history.

(56) References Cited

U.S. PATENT DOCUMENTS

| 8,611,094 B2* | 12/2013 | Aruga et al. ................... 361/749 |
| 2003/0051893 A1 | 3/2003 | Ichimasa et al. |
| 2008/0030666 A1* | 2/2008 | Abe et al. ....................... 349/150 |
| 2008/0068785 A1* | 3/2008 | Noguchi et al. ............... 361/681 |
| 2008/0074830 A1* | 3/2008 | Kurasawa ....................... 361/681 |
| 2008/0106874 A1* | 5/2008 | Okuda ........................... 361/749 |
| 2008/0123015 A1* | 5/2008 | Tanaka ............................ 349/58 |
| 2011/0199739 A1* | 8/2011 | Naganuma et al. ........... 361/749 |
| 2011/0317326 A1* | 12/2011 | Onishi et al. .................. 361/212 |

FOREIGN PATENT DOCUMENTS

| JP | 63-037079 U | 3/1988 |
| JP | 2001-135899 A | 5/2001 |
| JP | 2003-092158 | 3/2003 |
| JP | 2007-005636 A | 1/2007 |
| JP | 2007-123183 A | 5/2007 |
| JP | 2006-189469 A | 7/2007 |

OTHER PUBLICATIONS

SMK Company, "0.4 mm pitch FPC connector EN-41 Series", http://premium.ipros.jp/smk/product/detail/300282006?hub=54, Jul. 26, 2010.
JPOA—Office Action received from Japan Patent Office in connection with Japanese Patent Application No. 2010-254362 dated May 13, 2014 with Partial Translation.

* cited by examiner

*Primary Examiner* — Forrest M Phillips
(74) *Attorney, Agent, or Firm* — Fujitsu Patent Center

(57) ABSTRACT

There is provided a communication device that includes a first circuit board which includes a first ground pattern (GND) and a first signal line formed on a substrate, a ground pin electrically coupled with the first GND, where the ground pin protrudes from an end of the substrate, and a signal pin formed in the substrate and electrically coupled with the first signal line, where the signal pin protrudes from the end. The communication device further includes a send circuit board which includes a second GND and a second signal line, wherein when an end of the circuit board is inserted into a space between the ground pin and the signal pin, the first signal line and the second signal line are electrically coupled with each other via the signal pin and the first GND and the second GND are electrically coupled with each other via the ground pin.

10 Claims, 13 Drawing Sheets

S: SIGNAL LINE
G: GND LINE $P_S$: SIGNAL PIN
$P_G$: GND PIN

COMMUNICATION DEVICE AND METHOD OF COUPLING ELECTRICALLY CIRCUIT BOARDS

CROSS-REFERENCE TO RELATED APPLICATION

This application is based upon and claims the benefit of priority of the prior Japanese Patent Application No. 2010-254362, filed on Nov. 15, 2010 entire contents of which are incorporated herein by reference.

FIELD

The embodiments discussed herein are related to a communication device and a method of connecting circuit boards. More specifically, the present invention relates to a communication device for communicating information and a method of electrically coupling printed circuit boards.

BACKGROUND

Recently, large-capacity and high-speed optical transmission systems have been developed. Although the related art systems transmit signals at speeds of 10 Gbps, systems transmitting signals at speeds of 40 Gbps, or even 100 Gbps have been developed intensively.

In the design for mounting electronic equipment, connecting a flexible printed circuit board and a module via a connecter is widely used for signal transmission therebetween. The flexible printed circuit board is a flexible and bendable printed circuit board which is widely used in, for example, small-sized products with limited mounting space.

An optical transmitter converts electrical signals into optical signals and an optical receiver converts optical signals into electrical signals. In a connecting portion where electrical/optical conversion or optical/electrical conversion is carried out, electrical signals are typically transmitted to a printed circuit board via the flexible printed circuit board. A transmission speed at the portion has been also increased.

Japanese Laid-open Patent Publication No. 2007-123183 has proposed a connector which connects a flexible printed circuit board and a printed circuit board. Japanese Laid-open Patent Publication No. 2006-189469 has proposed a connector which includes an optical/electrical converter.

SUMMARY

According to an aspect of the invention, a communication device includes a first circuit board and a second circuit board. The first circuit board includes a substrate including a first ground pattern and a first signal line, a ground pin electrically coupled with the first ground pattern, where the ground pin protrudes from a first portion of an end of the substrate, and a signal pin formed in the substrate, electrically coupled with the first signal line, where the signal pin protrudes from a second portion of the end, the second portion being different from the first portion. The second circuit board includes a second ground pattern and a second signal line. When an end of the second circuit board is inserted into a space between the ground pin and the signal pin, the first signal line and the second signal line are electrically coupled with each other via the signal pin and the first ground pattern and the second ground pattern are electrically coupled with each other via the ground pin.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preliminary Consideration

In the related art systems, a connection of a flexible printed circuit board to a printed circuit board is typically made such that the flexible printed circuit board is inserted to a connector which is attached to the printed circuit board. If, however, high frequency signals are to be transmitted via the related art connector, nonnegligible degradation may occur in the transmission characteristics of the signals. This will cause insufficient use of high frequency areas of a transmission band and thus cause degradation in the band of the transmission signals. Accordingly, there is a problem that broadband signals may be difficult to be transmitted with desired transmission quality.

In one of aspects of the present invention, the embodiments have been made in view of these circumstances and intend to provide a communication device which prevents degradation in a transmission band and enables broadband transmission.

In another aspect of the present invention, the embodiments are related to a method of connecting printed circuit boards which prevents degradation in a transmission band and enables broadband transmission.

A communication device is provided in order to solve the above-described problems. The communication device includes: a first printed circuit board which includes a GND pin coupled to a first GND and protruding from an end surface and a signal pin electrically coupled to a first signal line and protruding from the end surface at a position different from that of the GND pin; and a second printed circuit board on which a second signal line and a second GND are mounted, wherein: one end of the second printed circuit board is inserted in a space between the signal pin and the GND pin; the first signal line and the second signal line are electrically coupled via the signal pin; and the first GND and the second GND are electrically coupled via the GND pin.

This configuration may prevent degradation in the transmission band.

Figure 1:
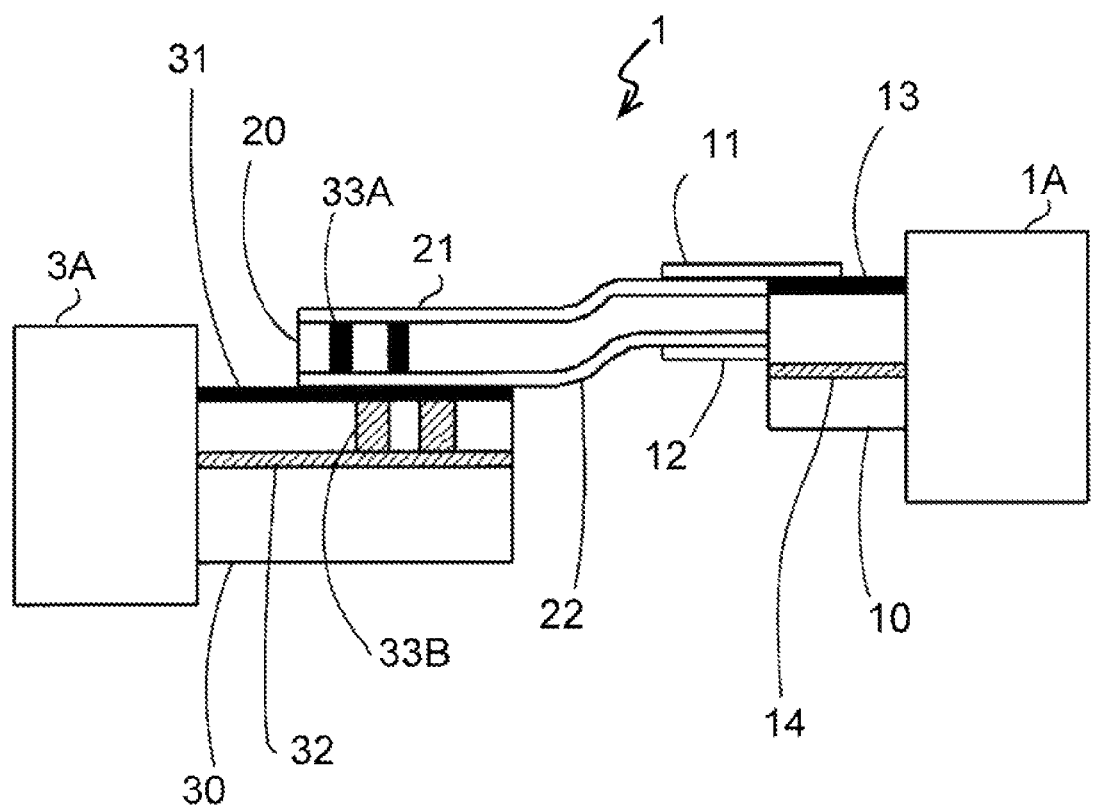
FIG. 1 illustrates an exemplary configuration of a communication device.

Hereinafter, an embodiment of the present invention will be described with reference to the drawings. FIG. 1 illustrates an exemplary configuration of a communication device. A communication device 1 includes a printed circuit board 10 (the first printed circuit board), a printed circuit board 20 (the second printed circuit board) and a printed circuit board 30 (the third printed circuit board).

For ease of understanding the state of connection between the printed circuit boards, the printed circuit board 10 is illustrated to protrude from a communication section 1A and the printed circuit board 30 is illustrated to protrude from a communication section 3A in FIG. 1. However, the printed circuit boards 10 and 30 are included in the communication section 1A and 3A, respectively.

The printed circuit board 20 is a flexible and bendable printed circuit board. An example thereof is a flexible printed circuit board. This printed circuit board 20 will be referred to as a flexible printed circuit board 20 in the following description. For the optical communication, the communication sections 1A and 3A are, for example, optical modules including an optical transmitter, an optical receiver or an optical modulator.

The printed circuit board 10 includes signal pins 11 and GND (ground) pins 12. The GND pins 12 are coupled to GND 14 (the first ground pattern, ground is hereinafter referred to as GND) embedded in the printed circuit board 10 and protruding from one end of the printed circuit board 10. The signal pins 11 and the GND pins 12 are preferably arranged alternately. The signal pins 11 are coupled to signal lines 13 (the first signal line) on the printed circuit board 10 and protrude from one end of the printed circuit board 10 for the connection.

The flexible printed circuit board 20 includes signal lines 21 (the second signal line) and GND (ground) 22 (the second GND). The printed circuit board 30 includes signal lines 31 (the third signal line) and GND 32 (the third GND).

One end of the flexible printed circuit board 20 is inserted in a space between the signal pins 11 situated above the GND pins 12 and the GND pins 12 situated below the signal pins 11 so as to connect the signal lines 13 and the signal lines 21, and the GND 14 and the GND 22.

The other end of the flexible printed circuit board 20 is coupled to the printed circuit board 30 such that the signal lines 21 are coupled to the signal lines 31 through, for example, vias 33A and that the GND 22 are coupled to the GND 32 through a via 33B. The via is metal part which connects electrically conductive patters disposed on different layers of a multilayered printed circuit board, for example.

Figure 2:
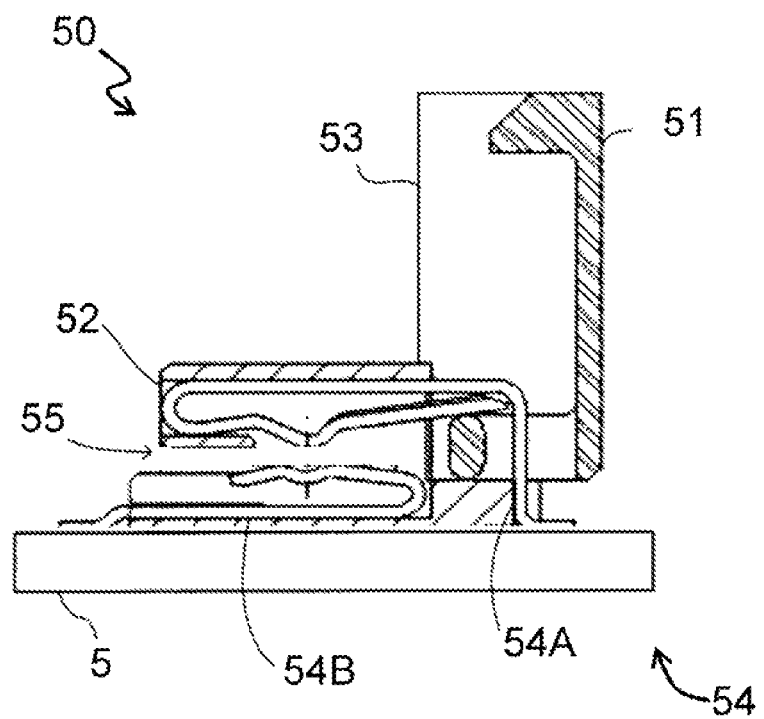
FIG. 2 illustrates a configuration of a connector.
Figure 3:
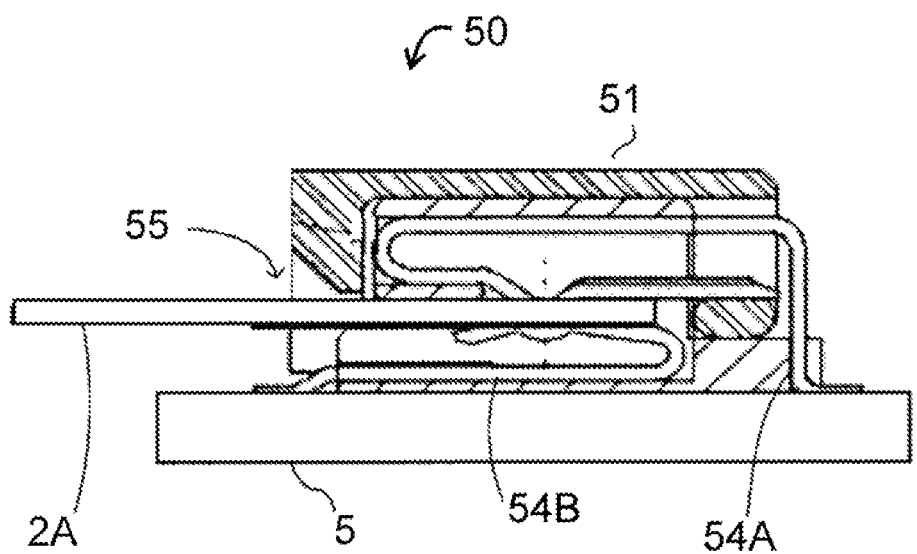
FIG. 3 illustrates a configuration of the connector.

A typical connector used for the connection of the flexible printed circuit board and the printed circuit board will be described. FIGS. 2 and 3 illustrate a configuration of the connector. A connector 50 includes an actuator 51, a socket 52, a housing (a socket cover) 53 and a terminal (a metal terminal) 54. The terminal 54 includes a signal terminal 54A and a GND terminal 54B.

The connector 50 is mounted on the printed circuit board 5 with the terminal 54 which is fixed and coupled with solder to, for example, a pad of a wiring lead on the printed circuit board 5. The actuator 51 is a driving section for the fixation of the flexible printed circuit board 2A.

FIG. 2 illustrates a state in which the actuator 51 is moved upward waiting for the insertion of the flexible printed circuit board 2A. FIG. 3 illustrates a state in which the flexible printed circuit board 2A is inserted in an insertion hole 55 and the actuator 51 is moved downward to fix the flexible printed circuit board 2A.

In the fixed state illustrated in FIG. 3, the signal lines mounted on the flexible printed circuit board 2A are coupled to signal lines mounted on the printed circuit board 5 via the signal terminal 54A. GND lines mounted on the flexible printed circuit board 2A are coupled to GND lines mounted on the printed circuit board 5 via the GND terminal 54B.

In this manner, wiring patterns of the flexible printed circuit board 2A and of the printed circuit board 5 are coupled to each other via the terminal 54 in the connector 50. The terminal 54 in the connector 50 is however, a mounting terminal with a bare metal surface and thus an inductance component is dominant. Accordingly, characteristic impedance varies due to an increase in the inductance component when high frequency signals are to be transmitted through the electrical connection described above.

This causes insufficient use of high frequency areas of a transmission band and thus causes degradation in the band of the transmission signals. Electrical signal are transmitted through the typical connector 50 at transmission speed up to 10 Gbps. The technique of the embodiments of the present invention has been made in view of these circumstances and provides a communication device which prevents degradation in a transmission band and enables broadband transmission, and a method of connecting printed circuit boards.

Figure 4:
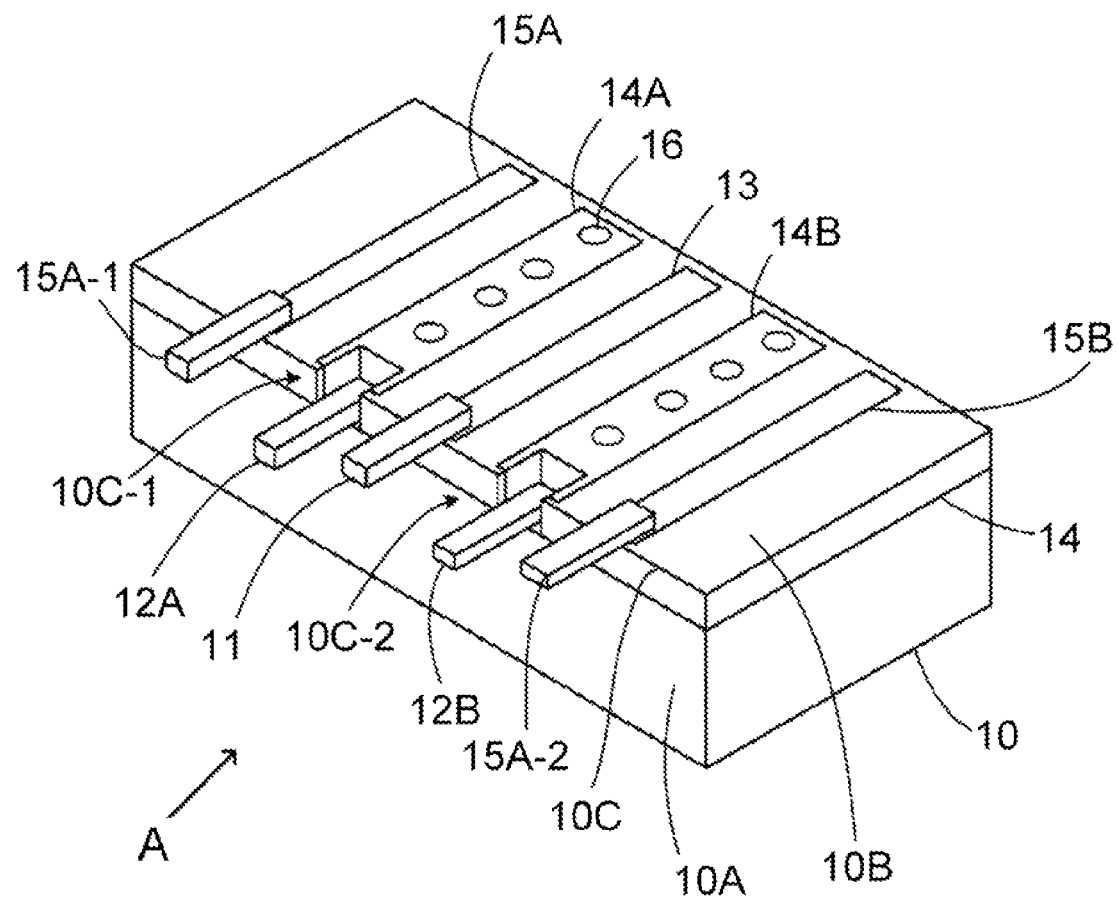
FIG. 4 illustrates a portion in which a printed circuit board is coupled to a flexible printed circuit board.

More detail will be described on a portion in which the printed circuit board 10 is coupled to flexible printed circuit board 20. FIG. 4 illustrates the portion of the printed circuit board 10 which is coupled to the flexible printed circuit board 20. Power source lines 15A and 15B, the signal lines (high frequency transmission lines) 13 and GND lines 14A and 14B are disposed on a surface 10B of the printed circuit board 10. The printed circuit board 10 is a multilayered circuit and the GND (embedded GND) 14 is arranged inside the printed circuit board 10.

Pins 15A-1 and 15B-1 are also coupled to the power source lines 15A and 15B and are coupled to power source lines mounted on the flexible printed circuit board 20 in the same manner as the signal lines and the GND lines which will be described below. Therefore, description of the connection of a power supply pattern will be omitted in the following description.

Figure 5:
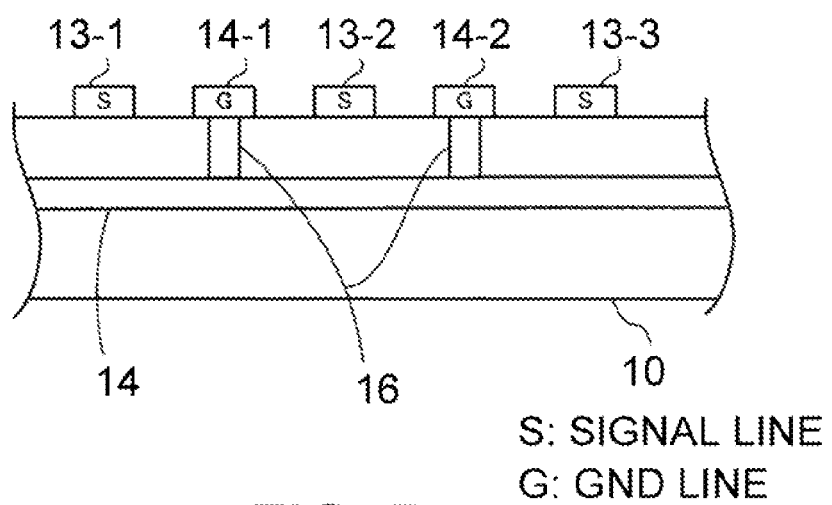
FIG. 5 illustrates an exemplary arrangement of signal lines and GND lines.

FIG. 5 illustrates an exemplary arrangement of signal lines and GND lines. The signal lines and the GND lines are arranged alternately on the surface 10B of the printed circuit board 10. In the configuration illustrated in FIG. 5, a GND line 14-1 is situated on the right of a signal line 13-1, a signal line 13-2 is situated on the right of a GND line 14-1, a GND line 14-2 is situated on the right of a signal line 13-2 and a signal line 13-3 is situated on the right of a GND line 14-2. The GND lines 14-1 and 14-2 and the embedded GND 14 are coupled via vias 16.

Returning to FIG. 4, a corner section 10C between a connecting surface 10A to the flexible printed circuit board 20 in the printed circuit board 10 and a surface 10B of the printed circuit board 10 is cut to reach the embedded GND 14 so as to provide corner sections 10C-1 and 10C-2 at which the GND lines 14A and 14B are mounted.

The GND pins 12A and 12B are coupled to the cut and exposed portions of the embedded GND 14 so as to protrude from the connecting surface 10A. The signal pins 11 is coupled to the signal lines 13 provided on the surface 10B of the printed circuit board 10 so as to protrude from the connecting surface 10A.

Figure 6:
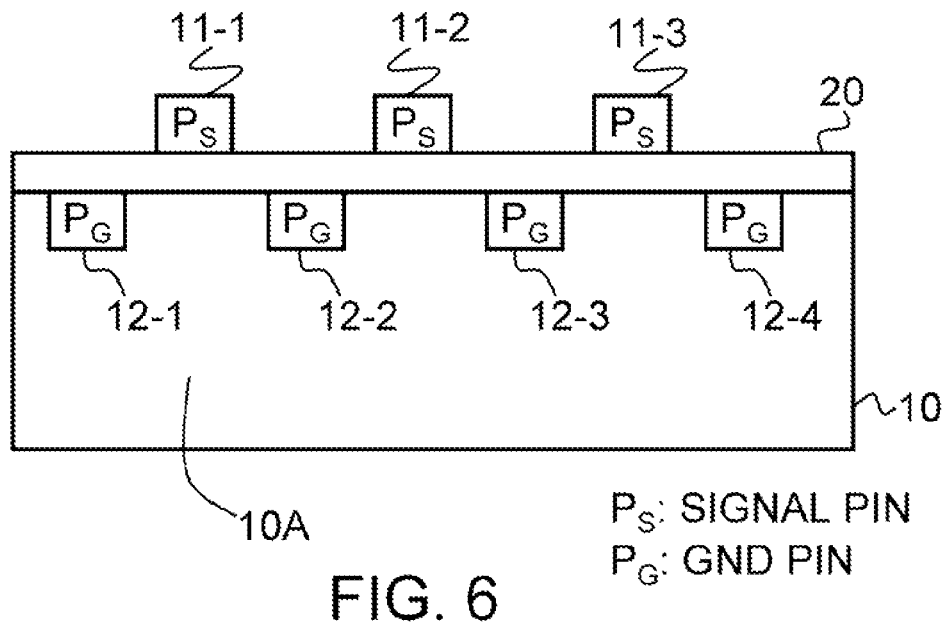
FIG. 6 illustrates a state in which the flexible printed circuit board is inserted between the signal pins and the GND pins.

FIG. 6 illustrates a state in which the flexible printed circuit board 20 is inserted between the signal pins and the GND pins. FIG. 6 corresponds to FIG. 4 seen from a direction A and illustrates an example in which signal pins 11-1 to 11-3 and GND pins 12-1 to 12-4 are attached to the connecting surface 10A of the printed circuit board 10.

The GND pins 12-1 to 12-4, which are coupled to the portions of the embedded GND 14 provided by cutting the corner section 10C of the printed circuit board 10 illustrated in FIG. 4, are situated lower than the signal pins 11-1 to 11-3 coupled to the surface 10B of the printed circuit board 10.

The flexible printed circuit board 20 is inserted in a space defined between the lower surfaces of the signal pins 11-1 to 11-3 and upper surfaces of the GND pins 12-1 to 12-4. The signal lines mounted on the flexible printed circuit board 20 and the signal pins 11-1 to 11-3 are coupled to each other, and the GND lines mounted on the flexible printed circuit board 20 and the GND lines 12-1 to 12-4 are coupled to each other.

Figure 7:
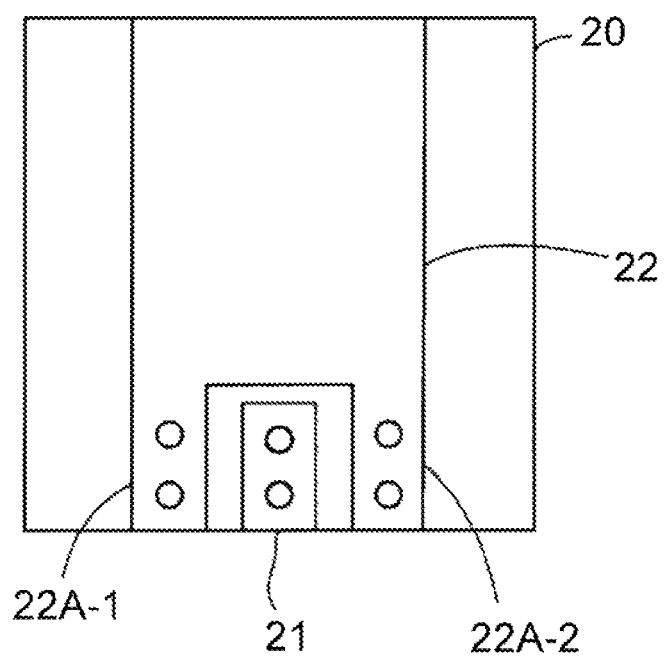
FIG. 7 illustrates a state in which a pattern is disposed on a back surface of the flexible printed circuit board.
Figure 8:
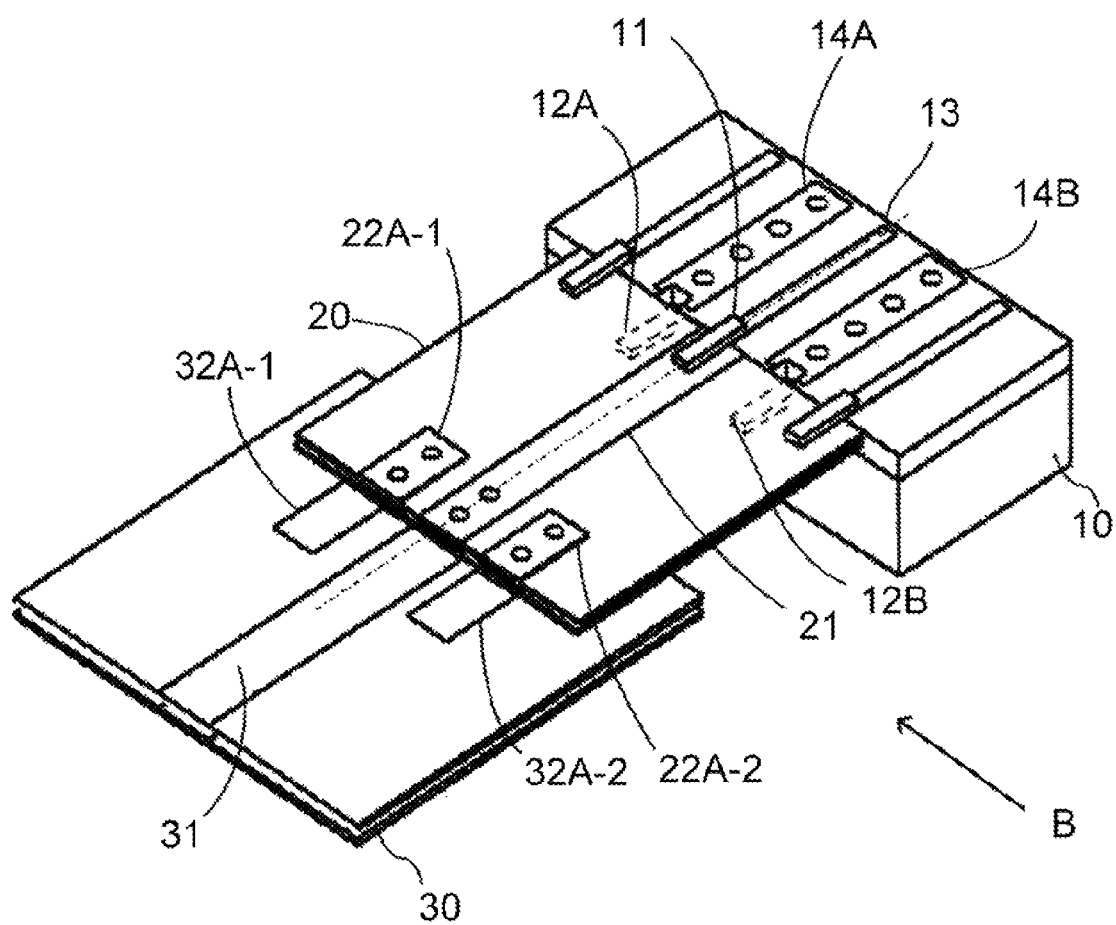
FIG. 8 illustrates a state in which the flexible printed circuit board and the printed circuit board are coupled to each other.

Next, a configuration of the communication device 1 will be described in further detail. FIG. 7 illustrates a back surface of the flexible printed circuit board 20. FIG. 8 illustrates a state of connection in which the flexible printed circuit board 20 connects the printed circuit boards 10 and 30.

As illustrated in FIG. 7, GND (a GND pattern) 22 which include GND lines 22A-1 and 22A-2 are provided on a back surface of the flexible printed circuit board 20. One of the signal lines 21 is provided between the GND lines 22A-1 and 22A-2. Round marks in the drawing represent vias.

FIG. 8 illustrates a state in which one end of the flexible printed circuit board 20 is coupled to the printed circuit board 10 and the other end of the flexible printed circuit board 20 is coupled to the printed circuit board 30. In the connection between the other end of the flexible printed circuit board 20 and the printed circuit board 30, the GND lines 22A-1 and 22A-2 mounted on the flexible printed circuit board 20 are coupled to the GND lines 32A-1 and 32A-2 on the printed circuit board 30. The signal lines 21 disposed on the flexible printed circuit board 20 and the signal lines 31 on the printed circuit board 30 are coupled to each other.

In summary, the connection of the signal lines and the GND lines by the connection between the printed circuit boards via the flexible printed circuit board 20 is as follows: the GND line 14A of the printed circuit board 10 is coupled to the GND line 32A-1 of the printed circuit board 30 via the GND pin 12A and the GND line 22A-1 of the flexible printed circuit board 20.

The GND line 14B of the printed circuit board 10 is coupled to the GND line 32A-2 of the printed circuit board 30 via the GND pin 12B and the GND line 22A-2 of the flexible printed circuit board 20. The signal lines 13 of the printed circuit board 10 is coupled to the signal lines 31 of the printed circuit board 30 via the signal pins 11 and the signal lines 21 of the flexible printed circuit board 20.

Figure 9:
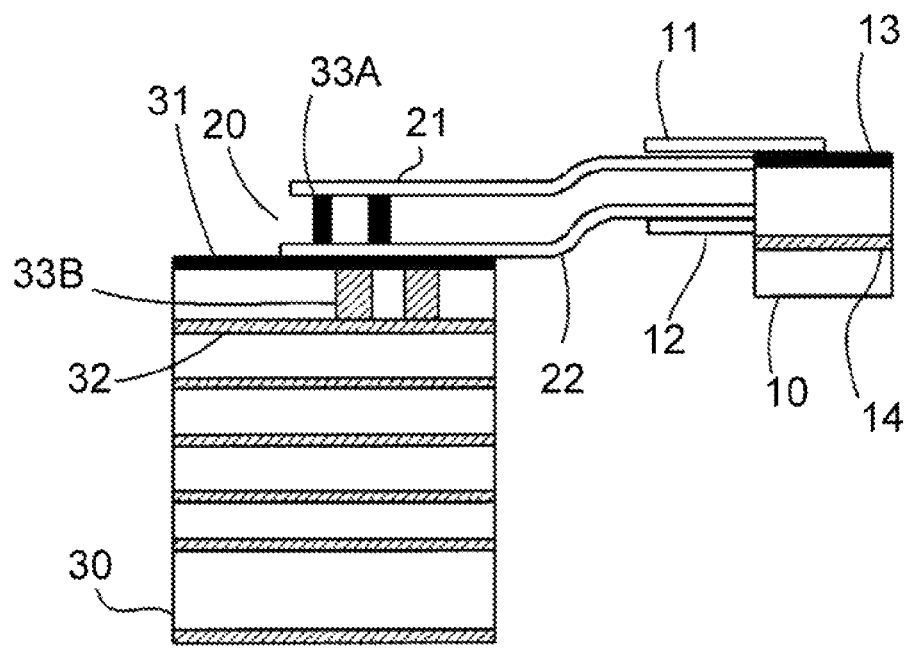
FIG. 9 corresponds to FIG. 8 seen from a direction B in FIG. 8.

FIG. 9 illustrates a connection corresponds to the connection in FIG. 8 seen from a direction B. One end of the flexible printed circuit board 20 is inserted in and fixed to the space between the signal pins 11 of the printed circuit board 10 and the GND pins 12 (corresponding to the GND pins 12A and 12B), and the other end of the flexible printed circuit board 20 is coupled to the printed circuit board 30.

The signal lines 13 of the printed circuit board 10 is coupled to the signal pins 11 and the signal pins 11 are coupled to the signal lines 21 of the flexible printed circuit board 20. The signal lines 21 is coupled to the signal lines 31 on the printed circuit board 30 via the via 33A in the flexible printed circuit board 20.

The GND 14 of the printed circuit board 10 is coupled to the GND pins 12 and the GND pins 12 are coupled to the GND 22 of the flexible printed circuit board 20. The GND 22 is coupled to the GNDs 32 (corresponding to the GNDs 32A-1 and 32A-2) embedded in the printed circuit board 30 via the via 33B in the printed circuit board 30.

As described above, in the communication device 1, since the printed circuit board 10 and the flexible printed circuit board 20 are coupled to each other without necessity of a connector used in the related art, the communication device 1 is less affected by an influence of the own characteristic of the connector. Accordingly, degradation in the transmission band may be prevented and broadband transmission may be enabled.

Next, a modification will be described. In the description above, one end of the flexible printed circuit board 20 is inserted in and fixed to the printed circuit board 10 using the flexible printed circuit board 20, and the other end is coupled to the printed circuit board 30. In the modification, a rigid flexible printed circuit board is used in place of the flexible printed circuit board 20.

The rigid flexible printed circuit board is formed as a layered product constituted by a rigid printed circuit board on which components may be mounted and a bendable flexible printed circuit board. Such a rigid flexible printed circuit board provides a degree of freedom in arrangement in which, for example, components are mounted on the rigid printed circuit board and the rigid printed circuit board and the connector is coupled by the flexible printed circuit board.

Figure 10:
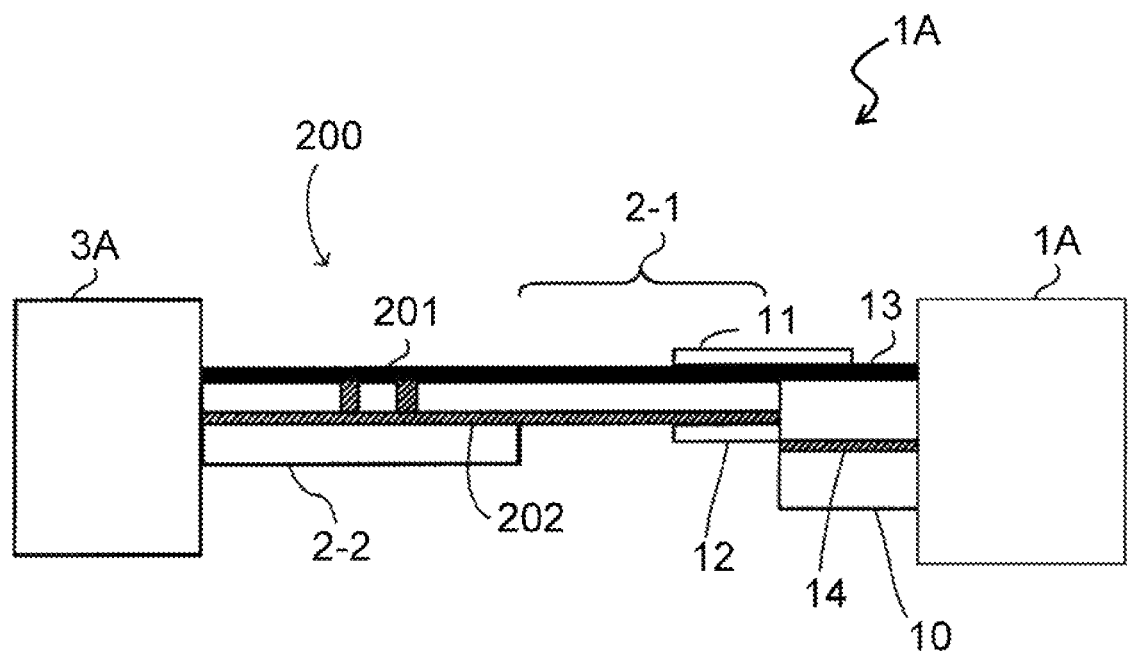
FIG. 10 illustrates an example as a modification.

FIG. 10 illustrates a modification. A communication device 1A includes a printed circuit board 10 and a rigid flexible printed circuit board 200. The rigid flexible printed circuit board 200 includes a flexible substrate portion 2-1 and a rigid printed circuit portion 2-2. The printed circuit board 10 is included in a communication section 1A and the rigid printed circuit portion 2-2 is included in a communication section 3A.

The printed circuit board 10 includes signal pins 11 and GND pins 12. The GND pins 12 are coupled to GND 14 (the first GND) which are embedded in the printed circuit board 10 and protrude from one end of the printed circuit board 10 for the connection. The signal pins 11 and the GND pins 12 are arranged alternately. The signal pins 11 are coupled to signal lines 13 (the first signal line) on the printed circuit board 10 and protrude from one end of the printed circuit board 10 for the connection.

Signal lines 201 (the second signal line) and GNDs 202 (the second GND) are disposed on the rigid flexible printed circuit board 200 across the flexible substrate portion 2-1 and the rigid printed circuit portion 2-2.

One end of the flexible substrate portion 2-1 is inserted, for the connection, in a space between the signal pins 11 situated above the GND pins 12 and the GND pins 12 situated below the signal pins 11.

The signal lines 13 of the printed circuit board 10 are coupled to the signal pins 11 and the signal pins 11 are coupled to the signal lines 201 disposed on the rigid flexible printed circuit board 200. The GND 14 of the printed circuit board 10 is coupled to the GND pins 12 and the GND pins 12 are coupled to the GND 202 disposed on the rigid flexible printed circuit board 200.

In the connection between the flexible printed circuit board 20 and the printed circuit board 30 in the communication device 1 illustrated in FIG. 1, any misalignment in connection between the signal lines 21 disposed on the flexible printed circuit board 20 and the signal lines 31 disposed on the printed circuit board 30 causes degradation in the transmission characteristic and thus it is important to prevent misalignment in connection.

In comparison, in the communication device 1A which uses the rigid flexible printed circuit board 200, since the rigid printed circuit portion 2-2 corresponds to the printed circuit board 30 on which electronic components may be mounted, the signal lines 21 of the flexible printed circuit board 20 and the signal lines 31 of the printed circuit board 30 may be considered to be integrated with each other.

As it is only necessary to consider misalignment in connection between the printed circuit board 10 and the flexible substrate portion 2-1, there may be less problem of misalignment in connection in the portions described above in the modification and it is possible to achieve a more stable transmission characteristic.

Figure 11:
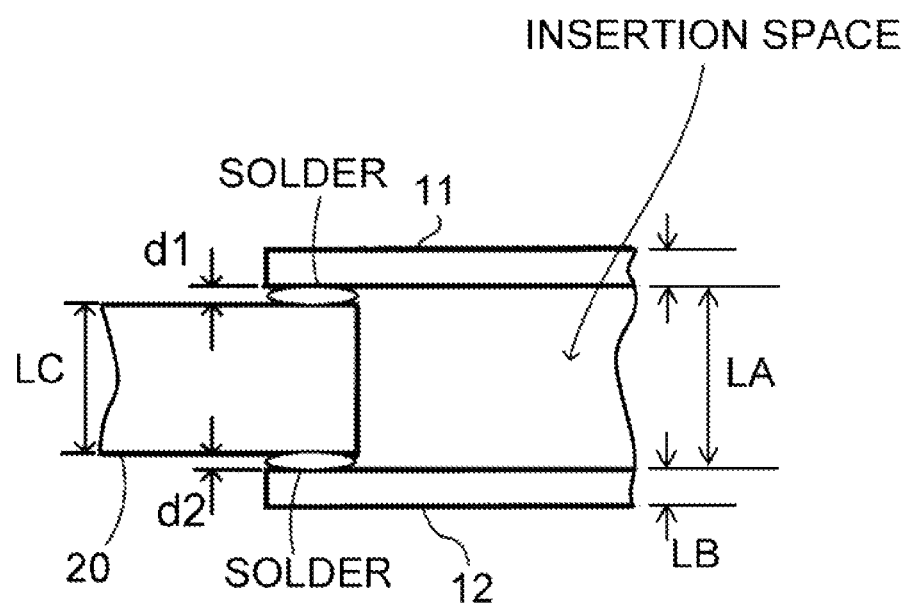
FIG. 11 is an explanatory view of a relation of connection between one end of the flexible printed circuit board and the printed circuit board.

Next, a relation of connection between one end of the flexible printed circuit board 20 and the printed circuit board 10 in the communication device 1 will be described. FIG. 11 is an explanatory view of a relation of connection between one end of the flexible printed circuit board 20 and the printed circuit board 10. The length between the lower surfaces of the signal pins 11 and the upper surfaces of the GND pins 12 is represented by LA. That is, the length in the vertical direction of the insertion space in which one end of the flexible printed circuit board 20 is inserted is represented by LA.

The thickness of the GND pins 12 is represented by LB and the thickness of the flexible printed circuit board 20 is represented by LC. The thickness of the solder for the connection between signal pins 11 and the flexible printed circuit board 20 is represented by d1 and the thickness of the solder for the connection between the GND pins 12 and the flexible printed circuit board 20 is represented by d2.

The flexible printed circuit board 20, which is inserted in the insertion space of the printed circuit board 10, is coupled fixed to the printed circuit board 10 in a favorable manner when the sum of the thickness LC of one end of the flexible printed circuit board 20 and the thickness d1 and d2 of the solder substantially equals to the width LA of the insertion space. This relationship is represented by a relational expression LA=LC+d1+d2. The thickness LB of the GND pins 12 will be described later with reference to FIG. 13 and the thickness d1 of the solder will be described with reference to FIG. 14 and FIG. 15.

Figure 12:
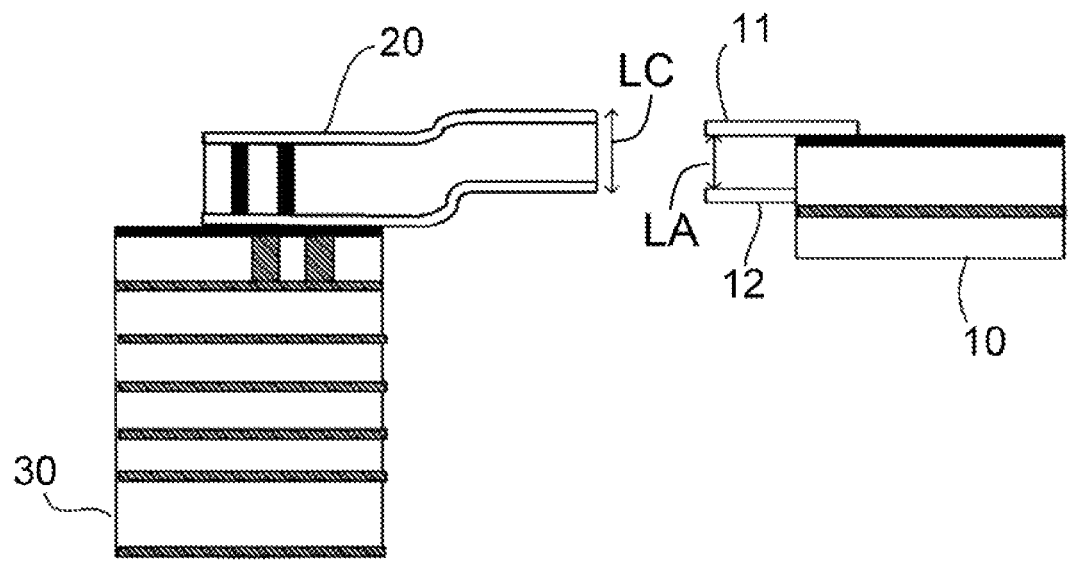
FIG. 12 illustrates a state in which one end of the flexible printed circuit board and the printed circuit board are unsuccessfully coupled to each other.

Next, cases in which the flexible printed circuit board 20 is unsuccessfully coupled to the printed circuit board 10 and an adjustment to turn the unsuccessful connection to a successful connection will be described. FIG. 12 illustrates a state in which one end of the flexible printed circuit board 20 and the printed circuit board 10 are unsuccessfully coupled to each other. If the thickness LC of one end of the flexible printed circuit board 20 is greater than the width LA of the insertion space (LC>LA), an unsuccessful connection is made.

Figure 13:
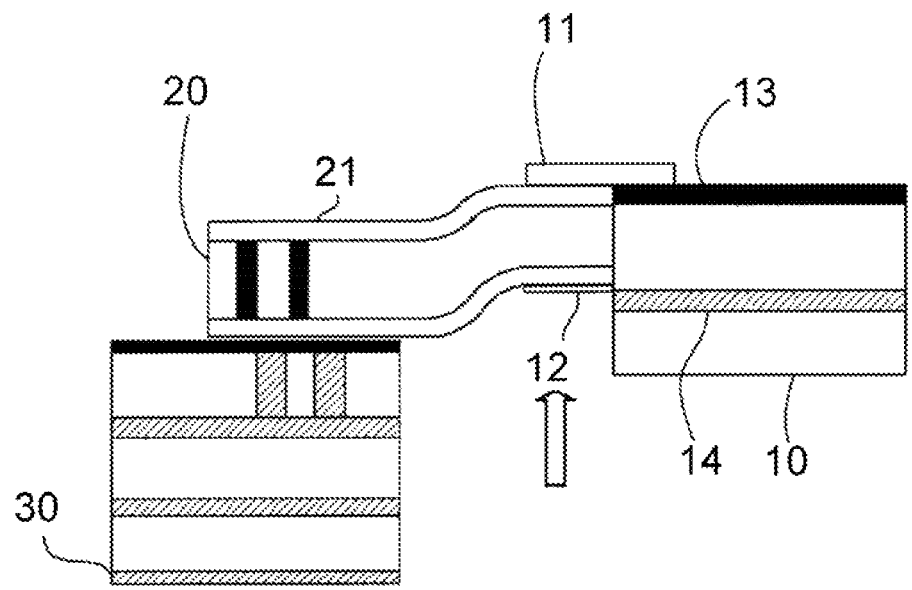
FIG. 13 illustrates an adjustment of length of an insertion space.

FIG. 13 illustrates an adjustment of length of the insertion space. Since the thickness LC of one end of the flexible printed circuit board 20 is greater than the width LA of the insertion space as illustrated in FIG. 12, the flexible printed circuit board 20 is unsuccessfully coupled to the printed circuit board 20. In such a case, the thickness LB of the GND pins 12 is adjusted to make the connection.

As illustrated in FIG. 13 (the solder is not illustrated), the thickness LB of the GND pins 12 is reduced such that one end of the flexible printed circuit board 20 may be inserted in the insertion space. Adjustment of the thickness of the signal pins 11 may cause a gap between the signal lines 21 and the signal pins 11. This may induce degradation in characteristic. Accordingly, if LC>LA, the thickness LB of the GND pins 12 is adjusted to be LC<LA so as to make the connection and prevents degradation in transmission.

Figure 14:
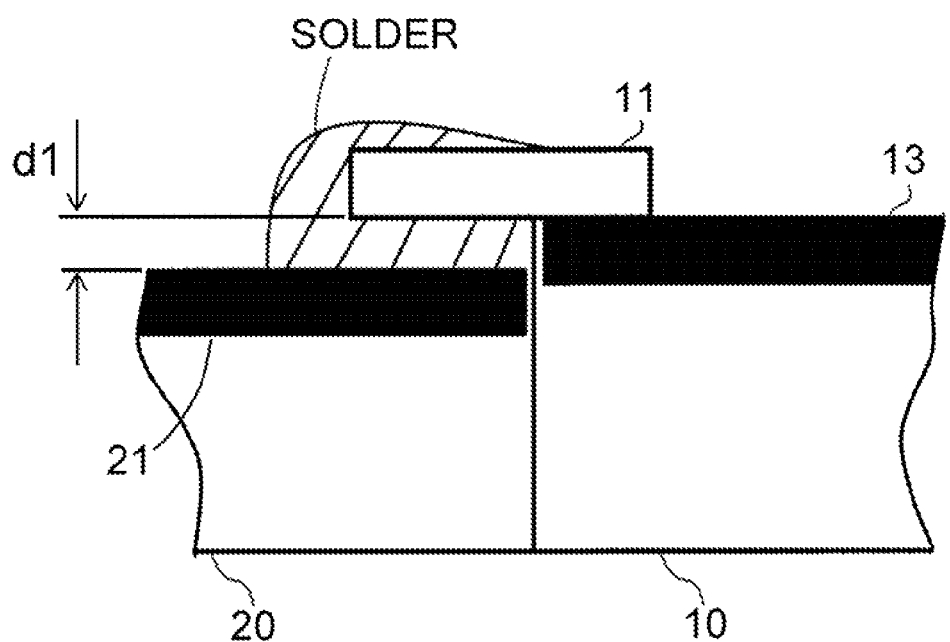
FIG. 14 illustrates a case in which the thickness of the solder is large.

Next, the thickness of the solder in the portion in which the flexible printed circuit board 20 and the printed circuit board 10 are coupled to each other will be described. FIG. 14 illustrates a case in which the thickness of the solder is large. A large thickness d1 of the solder in the portion in which the signal pins 11 and the flexible printed circuit board 20 are coupled to each other causes a mismatch in impedance between the signal lines 13 disposed on the printed circuit board 10 and the signal lines 21 disposed on the flexible printed circuit board 20. As a result, the transmission characteristic is degraded. Specifically, the thickness d1 of the solder exceeding 0.1 µm may adversely affect the transmission characteristic.

Figure 15:
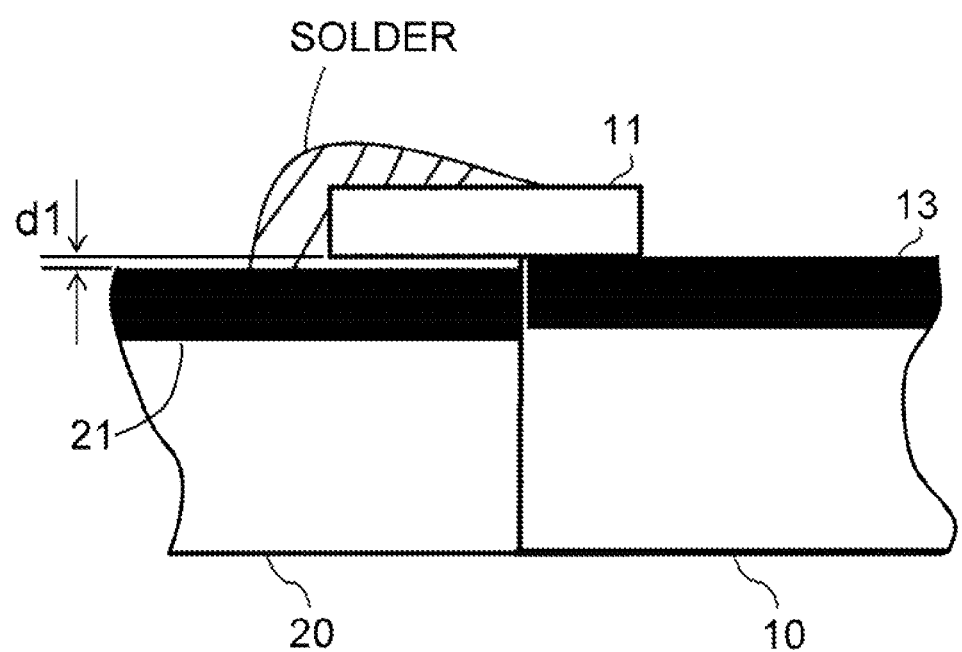
FIG. 15 illustrates a case in which the thickness of the solder is small.

FIG. 15 illustrates a case in which the thickness of the solder is small or thin. A small thickness d1 of the solder in the portion in which the signal pins 11 and the flexible printed circuit board 20 are coupled to each other causes a match in impedance between the signal lines 13 disposed on the printed circuit board 10 and the signal lines 21 disposed on the flexible printed circuit board 20. This configuration prevents degradation in the transmission characteristic. Specifically, the thickness d1 of the solder smaller than 0.1 µm may prevent degradation in the transmission characteristic.

Figure 16:
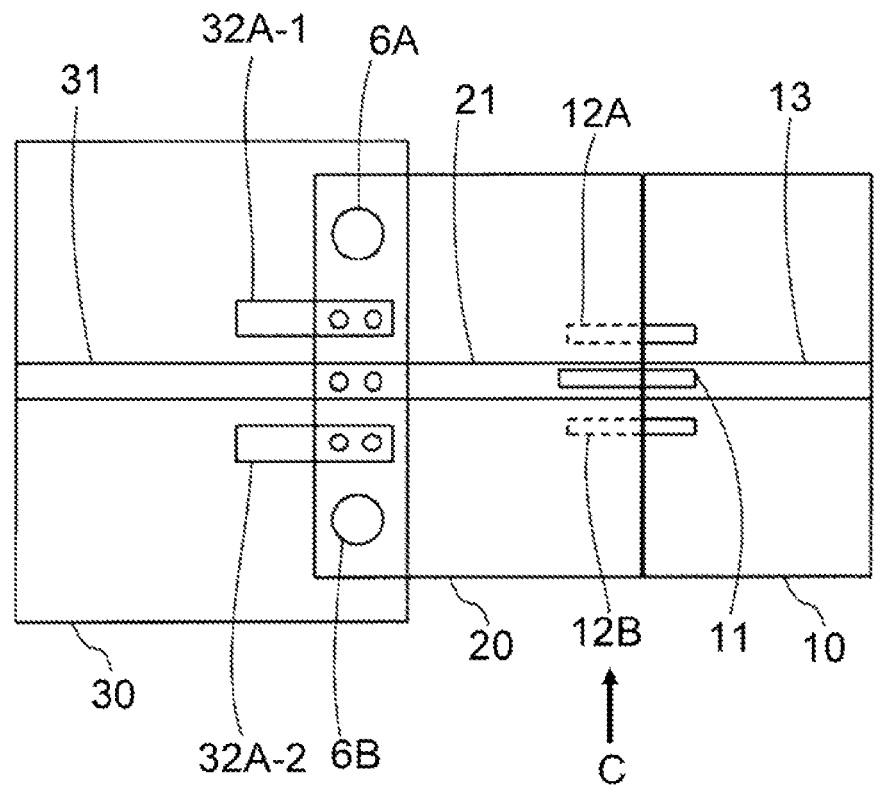
FIG. 16 illustrates a state in which the flexible printed circuit board and the printed circuit board are coupled to each other.
Figure 17:
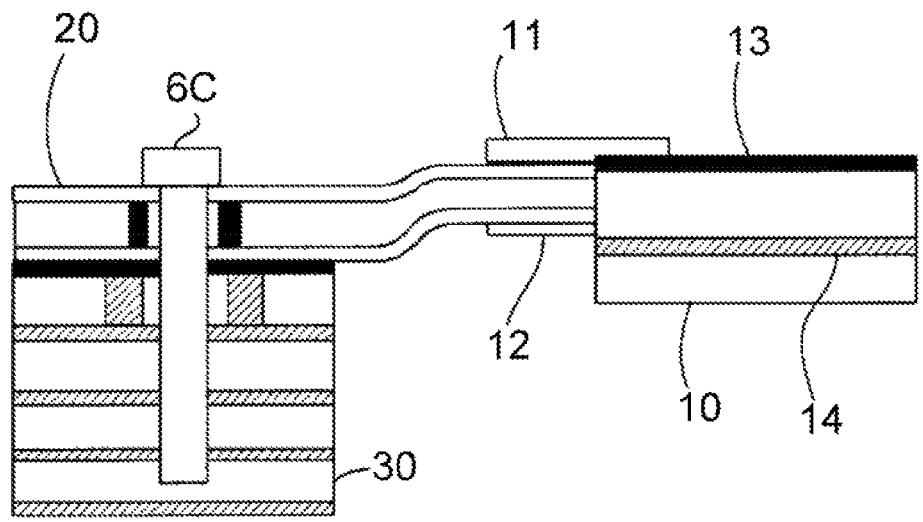
FIG. 17 illustrates a state in which the flexible printed circuit board and the printed circuit board are coupled to each other.

Next, a configuration provided with an alignment function will be described. FIGS. 16 and 17 illustrate a state of connection between the flexible printed circuit board 20 and the printed circuit boards 10 and 30. FIG. 17 illustrates the configuration corresponds to that seen from a direction C in FIG. 16.

As described above, the signal lines 13 of the printed circuit board 10 and the signal lines 31 on the printed circuit board 30 are coupled via the signal lines 21 on the flexible printed circuit board 20. In the connection between the flexible printed circuit board 20 and the printed circuit board 30, any misalignment in connection between the signal lines 21 and the signal lines 31 causes degradation in the transmission characteristic.

To avoid degradation in the transmission characteristic, alignment holes 6A and 6B are formed in the flexible printed circuit board 20 and the printed circuit board 30. Connecting positions of the signal lines 21 and the signal lines 31 are aligned with each other and an alignment pin 6C is inserted in both the alignment holes 6A and 6B and then soldered at predetermined positions of the flexible printed circuit board 20 and the printed circuit board 30.

Such an alignment mechanism easily and correctly prevents the misalignment in connection between the signal lines 21 and the signal lines 31 upon connection of the other end of the flexible printed circuit board 20 and the printed circuit board 30. It is therefore possible to reduce degradation in the transmission characteristic.

Figure 18:
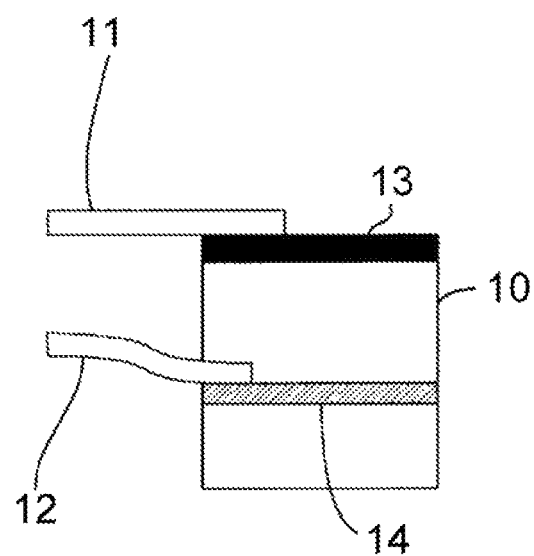
FIG. 18 illustrates forming of the GND pins.

In the description given above, prevention of the misalignment in connection of the signal lines 21 disposed on the flexible printed circuit board 20 and the signal lines 31 disposed on the printed circuit board 30 is illustrated. FIG. 18 illustrates another shape of the GND pins. The configuration illustrated in FIG. 18 prevents a misalignment in connection of the signal lines 13 disposed on the printed circuit board 10 and the signal lines 21 mounted on the flexible printed circuit board 20.

In a connection of the printed circuit board 10 and the flexible printed circuit board 20 such that one end of the flexible printed circuit board 20 is inserted in an insertion space of the printed circuit board 10, there is a possibility of a misalignment in connection occurring between the signal lines 13 of the printed circuit board 10 and the signal lines 21 of the flexible printed circuit board 20. In such a case, the GND pins 12 may be deformed to a desirable shape to prevent the misalignment in connection between the signal lines 13 and the signal lines 21 and to prevent degradation in the transmission characteristic.

Figure 19:
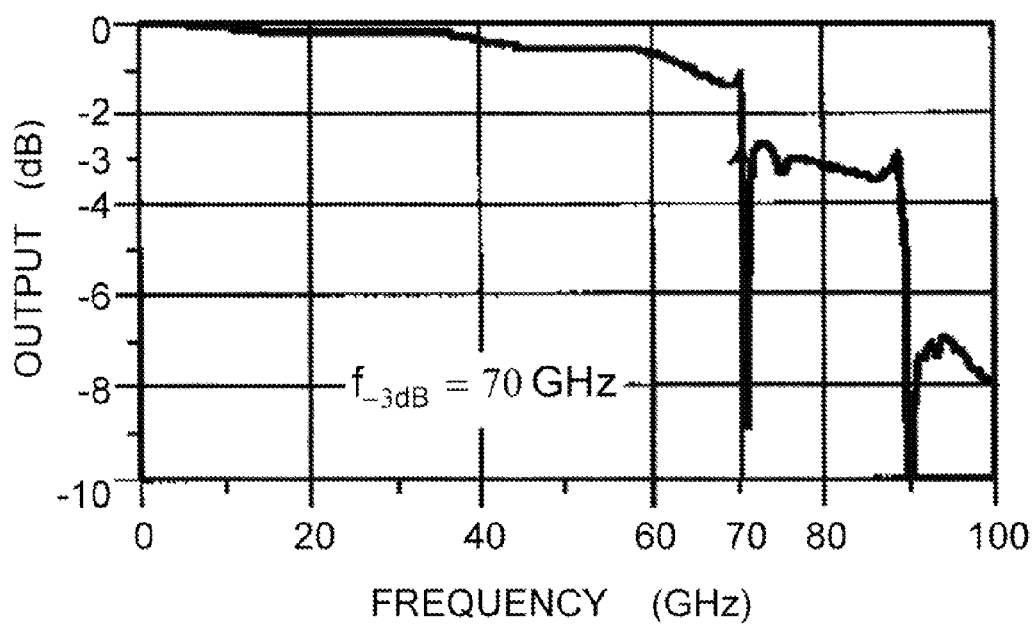
FIG. 19 illustrates a frequency characteristic.

Next, a simulation result will be described. FIG. 19 illustrates a frequency characteristic obtained by the simulation of the configurations such as that illustrated, for example, in FIG. 1 or 10. An output level (dB) is plotted on the vertical axis and the frequency (GHz) is plotted on the horizontal axis. FIG. 19 illustrates the frequency characteristic of signals transmitted through the flexible printed circuit board 20 in the communication device 1. The frequency band at −3 dB is about 70 GHz, this means that the broadband signal transmission up to 70 GHz is possible.

Although an embodiment has been described above, configurations of the components described therein may be replaced by other components having similar functions. Other structures and processes may be added arbitrarily.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A communication device comprising:
   a first circuit board including:
      a substrate including a first ground pattern and a first signal line,
      a ground pin electrically coupled with the first ground pattern and protruding from a first portion of an end of the substrate, and
      a signal pin formed in the substrate, electrically coupled with the first signal line, and protruding from a second portion of the end, the second portion being different from the first portion; and
   a second circuit board including a second ground pattern and a second signal line, an end of the second circuit board is inserted into a space between the ground pin and the signal pin, the first signal line and the second signal line are electrically coupled with each other via the signal pin and the first ground pattern and the second ground pattern are electrically coupled with each other via the ground pin.

2. The communication device according to claim 1, wherein a thickness of the ground pin is adjustable to adjust a length of the space along a thickness direction of the ground pin.

3. The communication device according to claim 1, further comprising
   a third circuit board having a positioning hole, the third circuit board includes:
      a third signal line, and
      a third ground pattern,
      wherein the second circuit board and the third circuit board are aligned with each other by an alignment pin inserted into both of the positioning hole and a hole formed in the second circuit board so that the second signal line and the third signal line are aligned with each other, and the second circuit board and the third circuit board are fixed each other to couple electrically the second signal line with the third signal line and to couple electrically the second ground pattern with the third ground pattern.

4. The communication device according to claim 1, wherein the following expressions A=C+d1+d2 and d1<0.1 μm are satisfied, A equals the space between the ground pin and the signal pin, C equals the thickness the end of the second circuit board, d1 equals the thickness of solder which connects the signal pin with the second circuit board, and d2 equals the thickness of solder which connects the ground pin with the second circuit board.

5. A communication device comprising:
   a first circuit board including:
      a substrate including a first ground pattern and a first signal line,
      a ground pin electrically coupled with the first ground pattern and protruding from an end of the substrate, and
      a signal pin electrically coupled with the first signal line and protruding from the end; and
   a second circuit board including a flexible substrate on which a second signal line and a second ground line are formed, the flexible substrate is inserted into a space between the ground pin and the signal pin, the first ground line is electrically coupled with the second ground line and the first signal line is electrically coupled with the second signal line.

6. A method of electrically coupling circuit boards, comprising:
   connecting a ground pin with a first ground pattern of a first circuit board so that the ground pin protrudes from a first portion of an end of the first circuit board:
   connecting a signal pin with a first signal line of the first circuit board so that the signal pin protrudes from a second portion of the end of the first circuit board, the second portion being different from the first portion;
   inserting an end of a second circuit board into a space between the ground pin and the signal pin, the second circuit board being flexible and including a second signal line and a second ground pattern;
   coupling electrically the first signal line with the second signal line via the signal pin; and
   coupling electrically the first ground pattern with the second ground pattern via the ground pin.

7. The method of electrically coupling circuit boards according to claim 6, wherein a thickness of the ground pin is adjustable to adjust a length of the space along a thickness direction of the ground pin.

8. The method of electrically coupling circuit boards according to claim 6, further comprising:
   providing a third circuit board including a positioning hole;
   aligning the second circuit board with the third circuit board;
   inserting an alignment pin into both of the positioning hole and a hole formed in the second circuit board; and
   fixing the second circuit board to the third circuit board to couple electrically the second signal line with the third signal line and to couple electrically the second ground pattern with the third ground pattern.

9. The method of electrically coupling circuit boards according to claim 6, further comprising:
   selecting a length A of the space in the direction, a thickness C of the end of the second circuit board, a thickness $d1$ of solder which connects the signal pin with the second circuit board, and a thickness $d2$ of solder which connects the ground pin with the second circuit board satisfy following expressions, $$A = C + d1 + d2 \text{ and } d1 < 0.1 \text{ μm}.$$

10. The communication device according to claim 1, wherein the ground pin and the signal pin protrude from the substrate in a direction parallel to the substrate.

* * * * *